United States Patent [19]
Watanabe

[11] Patent Number: 4,761,764
[45] Date of Patent: Aug. 2, 1988

[54] PROGRAMMABLE READ ONLY MEMORY OPERABLE WITH REDUCED PROGRAMMING POWER CONSUMPTION

[75] Inventor: Takeshi Watanabe, Tokyo, Japan

[73] Assignee: NEC Corporation, Tokyo, Japan

[21] Appl. No.: 853,509

[22] Filed: Apr. 18, 1988

[30] Foreign Application Priority Data

Apr. 18, 1985 [JP] Japan ................................ 60-82756

[51] Int. Cl.[4] .......................................... G11C 13/00
[52] U.S. Cl. ................................. 365/181; 365/185; 365/189
[58] Field of Search ...................... 365/181, 185, 189

[56] References Cited

U.S. PATENT DOCUMENTS 4,103,185  7/1978  Denes ................................ 365/181
4,228,527 10/1980  Gerber et al. .................... 365/181

Primary Examiner—Terrell W. Fears
Attorney, Agent, or Firm—Sughrue, Mion, Zinn, Macpeak, and Seas

[57] ABSTRACT

A programmable read only memory having an improved writing circuit is disclosed. The writing circuit includes a first field effect transistor of a conductivity type opposite to the conductivity type of a second field effect transistor constituting a memory cell. A programming current is supplied via the first transistor to the second transistor. The first transistor represents its load characteristic having a constant current region. A programming power consumption is thereby reduced.

7 Claims, 4 Drawing Sheets

PROGRAMMABLE READ ONLY MEMORY OPERABLE WITH REDUCED PROGRAMMING POWER CONSUMPTION

BACKGROUND OF THE INVENTION

The present invention relates to a nonvolatile semiconductor memory or a programmable read only memory in which each of the memory cell is composed of an insulated gate field effect transistor having a floating gate, and more particularly to a writing or programming circuit in such a memory.

A writing circuit in a semiconductor memory of the above-mentioned type includes a writing transistor connected in series to a selected one of memory cells to supply a programming voltage and current thereto. In the prior art, the writing transistor and the memory cell transistor are of the same conductivity or channel type. Therefore, the source of the writing transistor is connected to the memory cell transistor. The memory cell transistor is supplied with the programming voltage and current, so that electrons or holes are injected into the floating gate of the memory cell transistor. A programmed memory cell is thus obtained. The programmed memory cell continues to be supplied with a relatively high voltage responsive to the programming voltage for a programming period. For this reason, a channel breakdown occurs in the memory cell transistor to lower the potential at the connection point of the writing transistor and the memory cell transistor. In other words, the programmed memory cell has a negative resistance characteristic. The source potential of the writing transistor is thereby decreased to increase the current flowing through the writing transistor and the memory cell transistor.

Thus, the semiconductor memory including the prior art writing circuit consumes a considerably large programming power.

SUMMARY OF THE INVENTION

Therefore, the object of the present invention is to provide a semiconductor memory including an improved writing circuit.

Another object of the present invention is to provide a semiconductor memory in which a programming power consumption is reduced.

A semiconductor memory according to the present invention comprises a plurality of memory cells each including a first field effect transistor of one conductivity type having a floating gate, means for selecting one of the memory cells in response to address information, and means for supplying a programming current to the selected memory cell through a second field effect transistor of an opposite conductivity type.

In the present invention, the selected memory cell is thus supplied with the programming current through the second (i.e., writing) transistor of the opposite conductivity type to that of the memory cell transistor. Such a writing transistor represents a load characteristic having a constant current region. Therefore, even if channel breakdown occurs in the programmed memory cell, the current flowing through the memory cell is limited. The programming power consumption is thereby reduced remarkably.

In a preferred embodiment, the writing transistor is driven by a signal having an amplitude that is approximately equal to a potential differential between a programming voltage and a gate selection voltage of the selected memory cell in a data read operation. The constant current region in the load characteristic of the writing transistor is thereby broadened.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PRIOR ART

Figure 1:
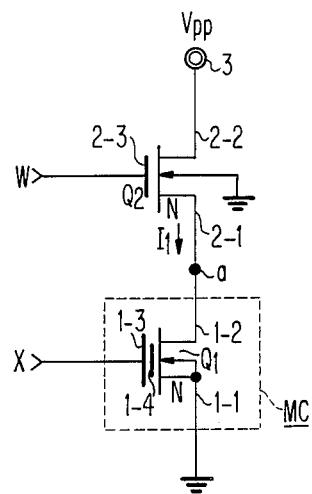
FIG. 1 is a circuit diagram representing a prior art programming operation.
Figure 2:
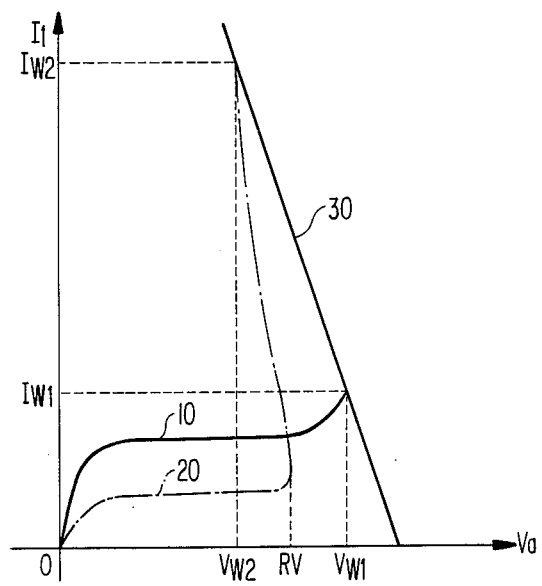
FIG. 2 is a graph showing a voltage-current characteristic of the circuit shown in FIG. 1.

Referring to FIGS. 1 and 2, a programming operation according to prior art will be described in order to facilitate the understanding of the present invention. A memory cell MC is composed of a transistor $Q_1$ of an N-channel type having a floating gate 1-4. When this memory cell is selected or designated, a transistor $Q_2$ of the same channel (N-channel) type as the transistor $Q_1$ is connected in series to $Q_1$. A writing signal W is supplied to the gate 2-3 of the transistor $Q_2$, the drain 2-2 of which is connected to a terminal 3 supplied with a programming voltage $V_{pp}$. The writing signal W depends on a data to be programmed and thus takes a $V_{pp}$ level when the data is "1", for example, and a zero volt level when it is "0". The source 1-1 of the memory cell transistor $Q_1$ is grounded and the control gate 1-3 thereof is supplied with a selection signal X from a decoder (not shown). The drain 102 of the transistor $Q_1$ is connected to the source 2-1 of the transistor $Q_1$, this connection point being represented by "a".

When the programming is carried out with respect to the memory cell MC, the programming voltage $V_{pp}$ is applied to the terminal 3 and the writing signal W assumes the $V_{pp}$ level to turn the transistor $Q_1$ ON. Consequently, the voltage $V_a$ at the point a takes a high voltage responsive to the $V_{pp}$ voltage. The selection signal X is at the $V_{pp}$ level. Thus, the drain 1-1 and the control gate 1-3 of the memory cell transistor $Q_1$ receive high voltages, so that electrons are injected into the floating gate 1-4 of $Q_1$. The floating gate 1-4 is thereby charged to a negative potential to increase a threshold voltage of the transistor $Q_1$.

Since the transistor $Q_2$ is of an N-channel type, it has a linear load characteristic represented by a line 30 in FIG. 2. In a graph of FIG. 2, an abscissa is a voltage $V_a$ at the point a and an ordinate is a current $I_1$ flowing through the transistors $Q_1$ and $Q_2$. On the other hand, a voltage-current characteristic of the memory cell transistor $Q_1$ before a programming is represented by a line 10 in FIG. 2. Accordingly, when the voltage $V_a$ at the point a becomes larger than a voltage $V_{W1}$ represented as an intersection of the lines 10 and 30, the transistor $Q_1$ is supplied with a current $I_{W1}$ to inject electrons into the floating gate 1-4 of $Q_1$. A programmed memory cell is thus obtained.

When the memory cell transistor $Q_1$ is brought into the programmed condition, its voltage-current characteristic is changed to a line 20 shown in FIG. 2. That is, since the floating gate assumes a negative potential and the drain 1-2 is applied with a high voltage, a high electric field occurs near the drain 1-2 to cause a channel breakdown in the transistor $Q_1$. In other words, the programmed memory cell transistor $Q_1$. In other words, the programmed memory cell transistor $Q_1$ represents a negative resistance at a voltage RV. As a result, the voltage $V_a$ at the point a is lowered to a value $V_{W2}$ and the current $I_1$ is increased to a value $I_{W2}$. The current value $I_{W2}$ is considerably larger than the value $I_{W1}$. A power consumption ($I_{W2} \times V_{pp}$) at this time is a part of a programming power consumption.

Thus, a semiconductor memory which includes a prior art writing circuit consumes a large programming power.

DETAILED DESCRIPTION OF THE INVENTION

Figure 3:
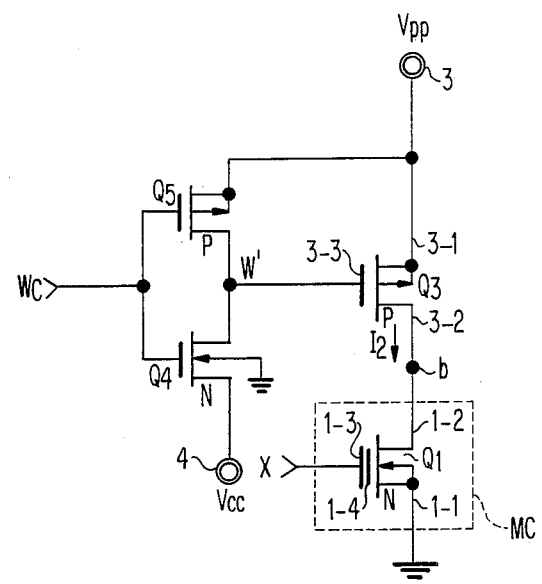
FIG. 3 is a circuit diagram representing a programming operation of the present invention.

FIG. 3 shows a circuit diagram representing a programming operation of the present invention. The same constituents as those shown in FIG. 1 are denoted by like references. In the present invention, the memory cell transistor $Q_1$ is supplied with a programming current through a transistor $Q_3$ that is of an opposite conductivity type to the transistor $Q_1$, i.e., a P-channel type. Therefore, the source 3-1 of $Q_3$ is connected to the terminal 3 along with its substrate electrode, and the drain 3-2 thereof is connected to the drain 1-2 of $Q_1$. The connection point of the drains of the transistors $Q_1$ and $Q_3$ is represented by "b". Moreover, the transistor $Q_3$ is driven by a writing signal W which has an amplitude that is approximately equal to a potential difference between the programming voltage $V_{pp}$ and a selection voltage supplied to the memory cell in a read-out operation. For this purpose, a P-channel transistor $Q_5$ and an N-channel transistor $Q_4$ are connected in series between terminals 3 and 4, and the connection point therebetween is connected to the gate 3-3 of the transistor $Q_3$. A writing control signal WC responsive to an input data is supplied in common to the gates of $Q_4$ and $Q_5$. The terminal 4 is supplied with a voltage of a $V_{cc}$ level. This voltage level is substantially equal to the selection level supplied to the memory cell in the read-out operation.

Figure 4:
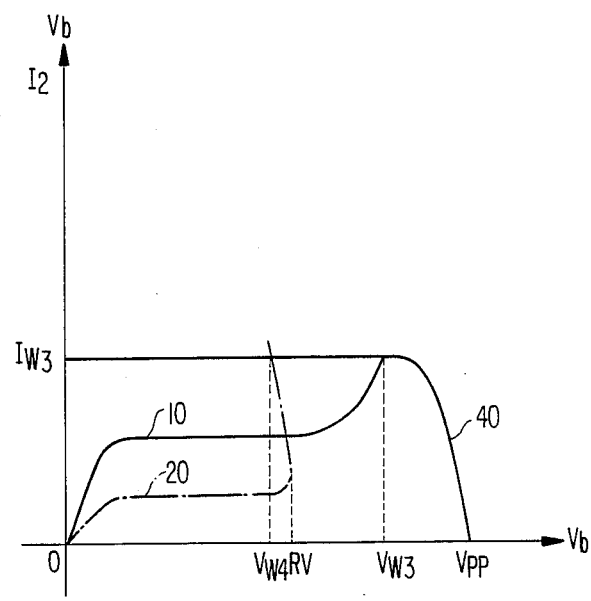
FIG. 4 is a graph showing a voltage-current characteristic of the circuit shown in FIG. 3.

Since the transistor $Q_3$ is of a P-channel type and the source 3-1 thereof is connected to the terminal 3, $Q_3$ represents a constant current characteristic when its gate-source voltage $V_{GS}$ is smaller in absolute value than its source-drain voltage $V_{DS}$ and a resistive characteristic when $V_{GS}$ is larger in absolute value than $V_{DS}$. Therefore, the load characteristic of the transistor $Q_3$ is completely different from that of the transistor $Q_2$ (FIG. 1) and is shown by a line 40 in FIG. 4. An abscissa of a graph in FIG. 4 is a voltage $V_b$ at the point b and an ordinate thereof is a current $I_2$ flowing through the transistors $Q_1$ and $Q_3$. The voltage-current characteristics of the memory cell transistor $Q_1$ before a programming and after it are not changed, as represented by lines 10 and 20 in FIG. 4, respectively.

In the programming, the point b therefore assumes a voltage $V_{W3}$ which is represented as an intersection of the lines 10 and 40 and the programming current $I_2$ having a value $I_{W3}$ flows through the transistor $Q_1$. It should be noted that the transistor $Q_3$ is supplied at its gate 3-3 with the $V_{cc}$ level, not with the ground level. Therefore, the constant current characteristic region of the transistor $Q_3$ is broadened, the current value $I_{W3}$ required for the programming is supplied surely to the transistor $Q_1$. The programming memory cell transistor $Q_1$ represents the negative resistance as mentioned hereinbefore, so that the voltage $V_b$ is lowered from the value $V_{W3}$ to a value $V_{W4}$. However, the constant current characteristic of the transistor $Q_3$ maintains the current $I_2$ flowing through the transistors $Q_1$ and $Q_3$ at the value $I_{W3}$. The programming power consumption is thereby reduced remarkably.

The writing control signal WC takes $O_v$ as its low level and $V_{pp}$ level as its high level, and the writing signal W takes $V_{cc}$ level as its low level and the $V_{pp}$ level as its high level. Therefore, the transistors $Q_4$ and $Q_5$ operate as a level conversion circuit.

Figure 5:
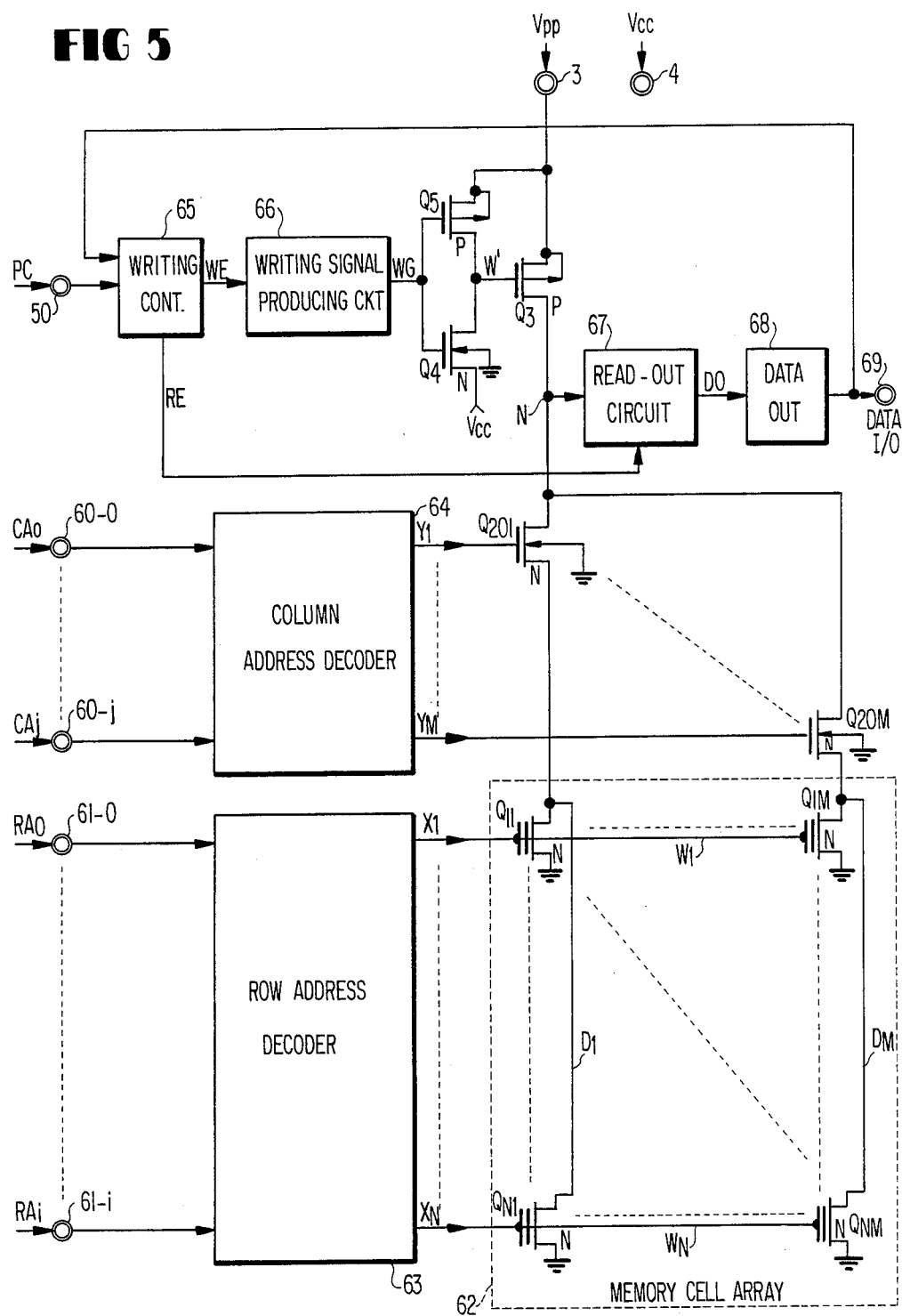
FIG. 5 is a diagram showing a preferred embodiment of the present invention.

FIG. 5 shows a semiconductor memory according to one embodiment of the present invention, in which the same constituents as those shown in FIG. 3 are denoted by like references. Each of a plurality of N-channel transistors $Q_{11}$ to $Q_{NM}$ has a floating gate and constitutes a memory cell. These transistors $Q_{11}$ to $Q_{NM}$ are arranged in rows and columns to form a memory cell array 62. The drains of the memory cell transistors disposed in the same column are connected in common to one of digit lines $D_1$ to $D_M$, and the control gates of the memory cell transistors disposed in the same row are connected in common to one of word lines $W_1$ to $W_N$. The sources of the transistors $Q_{11}$ to $Q_{NM}$ are connected to a reference potential (a ground potential, in this embodiment). The digit lines $D_1$ to $D_M$ are connected to a circuit node N through N-channel switching transistors $Q_{201}$ to $Q_{20M}$, respectively.

Row address signals $RA_O$ to $RA_i$ are supplied through row address terminals 61-O to 61-$i$ to a row decoder 63, and column address signals $CA_O$ to $CA_j$ are supplied through column address terminals 60-O to 60-j to a column decoder 64. The row decoder 63 applies a selection level to one of row selection signal $X_1$ to $X_N$. One of the word lines $W_1$ to $W_N$ is thereby energized. The column decoder 64 raises one of column selection signal $Y_1$ to $Y_M$ to the selection level. As a result, the associated one of the transistors $Q_{201}$ to $Q_{20M}$ is turned ON to energized one of the digit lines $D_1$ to $D_M$. The memory cell corresponding to the row and column address signals CA and RA is thus selected.

Figure 6:
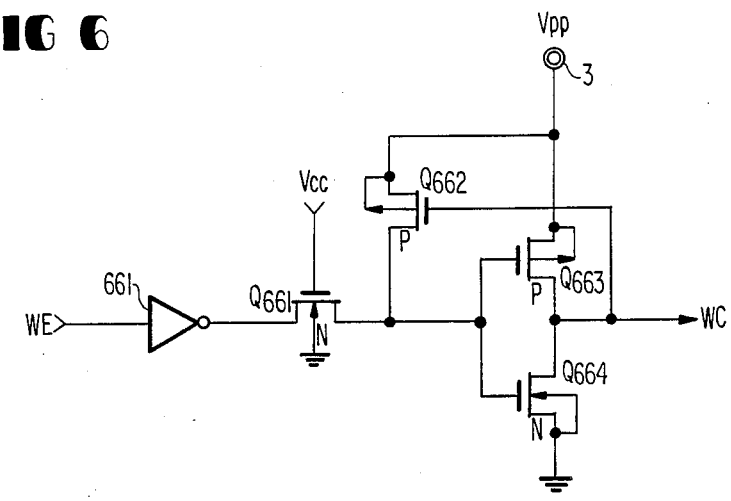
FIG. 6 is a circuit diagram of a writing signal producing circuit shown in FIG. 5.

A transistor $Q_3$ of an opposite conductivity type as the memory cell transistor (i.e., a P-channel type) is provided between the circuit node N and a terminal 3 in accordance with the present invention. The transistor $Q_3$ is driven by transistors $Q_4$ and $Q_5$ connected in series between the terminals 3 and 4. The writing control signal WC supplied to the gates of $Q_4$ and $Q_5$ is produced by a writing signal producing circuit 66. As shown in FIG. 6, in the circuit 66, a write-enable signal WE supplied thereto is inverted by an inverter 661 and the inverted signal is supplied through an N-channel transistor $Q_{661}$ to the gates of a P-channel transistor $Q_{663}$ and an N-channel transistor $Q_{664}$. The transistors $Q_{663}$ and $Q_{664}$ are connected in series between the terminal 3 and the ground, and the signal WC is produced the connection point thereof. The signal WC is fed back to a P-channel transistor $Q_{662}$. Accordingly, the writing signal producing circuit 66 determines the level of the writing control signal WC in response to the level of the write-enable signal WE. The signal WC takes either one of $O_v$ and $V_{pp}$. This signal is converted into the signal W taking either one of $V_{cc}$ and $V_{pp}$ by the transistors $Q_5$ and $Q_4$. $V_{pp}$ is larger in absolute value than $V_{cc}$.

The write-enable signal WE is produced by a writing control circuit 65. This circuit 65 responds to a programming control signal PC supplied to a terminal 50 and carries out a programming operation or a read-out operation.

In the programming operation, the terminal 3 is applied with the $V_{pp}$ level and the terminal 50 is supplied with the programming signal having a high level, for example. As a result, the writing control circuit 65 determines the level of the signal WE in response to an input data supplied to a terminal 69. The circuit 65 further supplies a signal RE having its level that inactivates a read-out circuit 67. When the signal WE responsive to the input data assumes the high level, the transistor $Q_3$ is supplied with $V_{cc}$ level and thus turned ON. On the other hand, in response to the row and column address signals CA and RA, the row and column decoder raise ones of the row and column selection signals X and Y to the selection level. This selection level takes the $V_{pp}$ level in the programming operation. The programming voltage and current are thus supplied through the transistor $Q_3$ to the selected memory cell to carry out the programming thereto. The programming power consumption in this operation is remarkably small as explained with reference to FIGS. 3 and 4.

In the read-out operation, the terminal 3 is connected to the terminal 4 to receive the $V_{cc}$ level, and the low level signal PC is supplied to the terminal 50. The writing control circuit 65 changes the signal WE to a level that maintains the transistor $Q_3$ in an off-state and produces a read-enable signal RE to the read-out circuit 67. One of the row selection signals X and one of column selection signals Y are raised to a selection level in response to address signals RA and CA. The selection level at this time assumes about $V_{cc}$ level since the terminal 3 receives the $V_{cc}$ level. When the programmed memory cell is selected, this cell is maintained in the off-state, since its threshold voltage is higher than the selection level of the signal X. To the contrary, when the unprogrammed memory cell is selected, it is turned ON to lower the potential at the node N. The potential at the node N is supplied to the read-out circuit 67 as a cell data.

Figure 7:
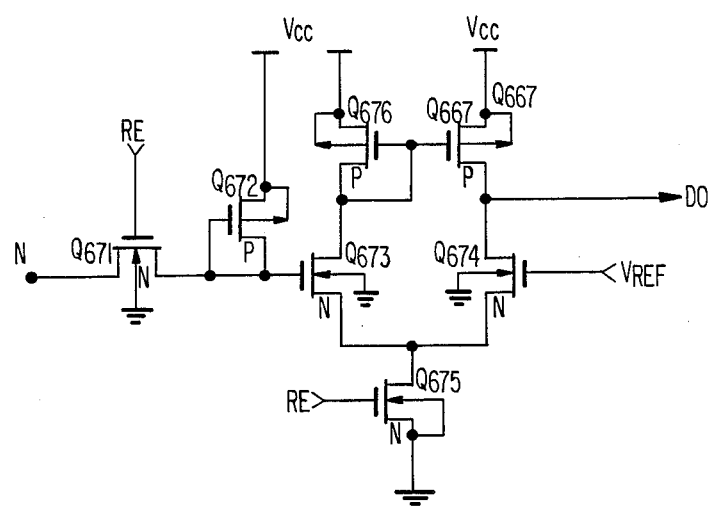
FIG. 7 is a circuit diagram of a read-out circuit shown in FIG. 5.

As shown in FIG. 7, the read-out circuit 67 includes N-channel transistors $Q_{673}$ and $Q_{674}$ connected in a differential form. The gate of the transistor $Q_{673}$ is connected to the circuit node N through an N-channel transistor $Q_{671}$, and the gate of the transistor $Q_{674}$ is supplied with a reference voltage $V_{REF}$. An N-channel transistor $Q_{675}$ operating as a current source is connected to the source connection point of $Q_{673}$ and $Q_{674}$. P-channel transistors $Q_{676}$ and $Q_{677}$ constitute a current mirror load, and from the connection point of the transistors $Q_{677}$ and $Q_{674}$ a read-out data DO supplied to a data output circuit 68 (FIG. 5) is derived. The transistors $Q_{671}$ and $Q_{675}$ are supplied at their gates with the read-enable signal RE. The signal RE takes the low level in the programming operation to inactivate the read-out circuit 67 and assumes the high level in the read-out operation to turn the transistors $Q_{671}$ and $Q_{675}$ ON. The circuit 67 is thereby activated.

When the programmed memory cell is selected, the circuit node N is disconnected from the ground. However, a P-channel transistor $Q_{672}$ is provided, and therefore the gate of the transistor $Q_{673}$ receives a high voltage. When the unprogrammed memory cell is selected, the potential at the node, i.e., the potential at the gate of the transistor $Q_{673}$, takes a resistance divided voltage determined by the transistor $Q_{672}$, the switching transistor $Q_{20h}$ (h=1 to M) and the memory cell transistor. The reference voltage $V_{REF}$ supplied to the transistor $Q_{674}$ is selected to an intermediate level between the above-mentioned high voltage and the resistance divided voltage. As a result, the read-out data DO takes the high level or the low level in response to the programmed cell or the unprogrammed cell, respectively. The read-out data DO is supplied to the data output circuit 68, so that an output data $D_{OUT}$ is derived from the terminal 69. The terminal 69 is thus used as a data input/output terminal.

The present invention is not limited to the above-described embodiment, but may be changed and modified without departing from the scope and spirit of the present invention. For example, a plurality of terminals 69 can be provided.

What is claimed is:

1. A semiconductor memory comprising a plurality of memory cells each including a first field effect transistor of one conductivity type having a floating gate, a reference terminal supplied with a reference voltage, a node, means responsive to address information for selecting at least one of said memory cells to connect said at least one memory cell between said reference terminal and said node, a programming terminal supplied with a programming voltage, through a second field effect transistor of an opposite conductivity type connected between said programming terminal and said node, and means for supplying a gate of said second field effect transistor in a programming operation with a writing voltage having an intermediate level between said programming voltage and said reference voltage, whereby said second field effect transistor contributes to make a current flowing through the selected memory cell substantially constant before and after said selected memory cell is programmed.

2. The memory as claimed in claim 1, said writing voltage being approximately equal to a voltage supplied to the selected memory cell in a read-out operation.

3. A semiconductor memory comprising at least one first transistor of one conductivity type having a floating gate, said first transistor constituting a memory cell, a first terminal supplied with a reference voltage, a circuit node, means for connecting said first transistor between said first terminal and said circuit node, a second terminal supplied with a first voltage in a programming operation, a second transistor of an opposite conductivity type connected between said second terminal and said circuit node, a third terminal supplied with a second voltage in said programming operation, said second voltage being an intermediate voltage between said reference voltage and said first voltage, a third transistor of said opposite conductivity type connected between said second terminal and a gate of said second transistor, a fourth transistor of said one conductivity type connected between said third terminal and the gate of said second transistor, gates of said third and fourth transistors being connected in common, and means for supplying gates of said third and fourth transistors in said programming operation with such a control voltage that turns said fourth transistors ON and said third transistor OFF to apply said second voltage to the gate of said second transistor.

4. The memory as claimed in claim 3, wherein said control voltage has an amplitude between said reference voltage and said first voltage and said fourth transistor is turned ON when said control voltage takes said first voltage, said third transistor being turned ON when said control voltage takes said reference voltage.

5. The memory as claimed in claim 3, wherein said second terminal is supplied with said second voltage in a read-out operation and said second transistor is held in an off-state.

6. A semiconductor memory comprising a plurality of word lines, a plurality of digit lines, a plurality of N-channel type memory transistors, each of said memory transistors having a floating gate, a control gate connected to one of said word lines and a source-drain current path connected between one of said digit lines and a reference potential point, a circuit node, a plurality of gate transistors, each of said gate transistors being connected between said circuit node and an associated one of said digit lines, a first decoder energizing one of said word lines in response to a first set of address signals, a second decoder turning ON one of said gate transistors in response to a second set of address signals, a first terminal supplied with a programming voltage in a programming operation, a second terminal supplied with an intermediate voltage between said programming voltage and a reference potential at said reference potential point, a switching transistor of a P-channel type having a source-drain current path connected between said first terminal and said circuit node, a third terminal receiving a programming control signal, means for producing a writing signal in response to said programming control signal, said writing signal taking either one of a first level substantially equal to said reference potential and a second level substantially equal to said programming voltage, a level conversion circuit converting said first and second levels of said writing signal into third and fourth levels, said third level being substantially equal to said intermediate voltage and said fourth level being substantially equal to said programming voltage, and means for applying the output of said level conversion circuit to a gate of said switching transistor.

7. The memory as claimed in claim 6, wherein said first terminal is supplied with said intermediate voltage in a read-out operation and said switching transistor is maintained OFF in said read-out operation.

* * * * *

UNITED STATES PATENT AND TRADEMARK OFFICE
CERTIFICATE OF CORRECTION

PATENT NO. : 4,761,764

DATED : August 2, 1988

INVENTOR(S) : WATANABE

It is certified that error appears in the above-identified patent and that said Letters Patent is hereby corrected as shown below:

Change filing date on the face of the Patent from "April 18, 1988" to --April 18, 1986--.

COLUMN 3, LINES 9 AND 10    Delete "In other words the programmed memory cell transistor $Q_1$."

Signed and Sealed this

Third Day of January, 1989

Attest:

DONALD J. QUIGG

*Attesting Officer*  *Commissioner of Patents and Trademarks*